US012712254B2

(12) United States Patent
Tu et al.

(10) Patent No.: US 12,712,254 B2
(45) Date of Patent: Aug. 18, 2026

(54) ANTENNA MODULE AND PORTABLE ELECTRIC DEVICE USING THE SAME

(71) Applicant: QuantumZ Inc., Kaohsiung City (TW)

(72) Inventors: Kun Yen Tu, Kaohsiung City (TW); Po-Ting Chen, Kaohsiung City (TW); Sin-Siang Wang, Kaohsiung City (TW); Wei Ting Lee, Kaohsiung City (TW)

(73) Assignee: QuantumZ Inc., Kaohsiung City (TW)

( * ) Notice: Subject to any disclaimer, the term of this patent is extended or adjusted under 35 U.S.C. 154(b) by 117 days.

(21) Appl. No.: 18/749,581

(22) Filed: Jun. 20, 2024

(65) Prior Publication Data

US 2025/0023223 A1 Jan. 16, 2025

Related U.S. Application Data

(60) Provisional application No. 63/513,357, filed on Jul. 13, 2023.

(51) Int. Cl.

| | |
|---|---|
| ***H01Q 1/22*** | (2006.01) |
| ***H01Q 1/38*** | (2006.01) |
| ***H05K 1/02*** | (2006.01) |
| ***H05K 1/03*** | (2006.01) |
| *H01Q 15/14* | (2006.01) |

(52) U.S. Cl.

CPC ................ *H01Q 1/22* (2013.01); *H01Q 1/38* (2013.01); *H05K 1/028* (2013.01); *H05K 1/032* (2013.01); *H01Q 15/14* (2013.01); *H05K 2201/0141* (2013.01); *H05K 2201/10098* (2013.01)

(58) Field of Classification Search

CPC ............ H01Q 1/22; H01Q 1/38; H01Q 15/14; H01Q 21/28; H01Q 1/243; H01Q 23/00; H05K 1/028; H05K 1/032; H05K 2201/0141; H05K 2201/10098

See application file for complete search history.

(56) References Cited

U.S. PATENT DOCUMENTS

2013/0099992 A1* 4/2013 Wu ........................ H01Q 21/28 343/841
2022/0102864 A1* 3/2022 Morimoto ............ H01Q 1/3291
2022/0368031 A1* 11/2022 Gouchi ................ H01Q 1/2283

FOREIGN PATENT DOCUMENTS

JP 2003332830 A * 11/2003

* cited by examiner

*Primary Examiner* — Seung H Lee

(74) *Attorney, Agent, or Firm* — CKC & Partners Co., LLC

(57) ABSTRACT

An antenna module and a portable electric device are provided. The antenna module includes a flexible substrate, a first antenna circuit and a second antenna circuit. Each of an L-shaped bent portion and a U-shaped bent portion of the flexible substrate has a first end and a second end opposite to each other. The first end of the L-shaped bent portion is connected to a first main body of the flexible substrate. The first end of the U-shaped bent portion is connected to the second end of the L-shaped bent portion. The second end of the U-shaped bent portion is connected to a second main body of the flexible substrate. The first antenna circuit and the second antenna circuit are respectively disposed on the first main body and the second main portion. The portable electric device includes a casing and the antenna module disposed at a corner.

15 Claims, 6 Drawing Sheets

ANTENNA MODULE AND PORTABLE ELECTRIC DEVICE USING THE SAME

CROSS-REFERENCE TO RELATED APPLICATION

This application claims priority to U.S. Provisional Application Ser. No. 63/513,357, filed Jul. 13, 2023, which is herein incorporated by reference.

BACKGROUND

Field of Invention

The present invention relates to an antenna module and a portable electric device using the same.

Description of Related Art

Electronic products such as tablet PC, notebook (NB) and smart phone or other portable electric devices are becoming part of our daily lives. In order to meet users' demands for the portable electric devices having small dimensions, antenna modules are often disposed at a corner of the portable electric device, thereby saving the inner space of the portable electric device.

SUMMARY

Therefore, the present invention provides an antenna module and a portable electric device using the same, in which the corner space of the portable electric device may be utilized and plural antenna radiation directions are provided.

In accordance with an embodiment of the present invention, the antenna module includes: a flexible substrate, a first antenna circuit and a second antenna circuit. The flexible substrate includes: a first main body, a second main body, an L-shaped bent portion and a U-shaped bent portion. The L-shaped bent portion has a first end and a second end opposite to each other, wherein the first end of the L-shaped bent portion is connected to the first main body. The U-shaped bent portion has a first end and a second end opposite to each other, wherein the first end of the U-shaped bent portion is connected to the second end of the L-shaped bent portion, and the second end of the U-shaped bent portion is connected to the second main body. The first antenna circuit is disposed on the first main body. The second antenna circuit is disposed on the second main body.

In some embodiments, the antenna module further includes an antenna communication chip. The antenna communication chip is electrically connected to the first antenna circuit and the second antenna circuit to perform wireless communication by using the first antenna circuit and the second antenna circuit, The antenna communication chip is located at a first side of the L-shaped bent portion, the second main body is located at a second side of the L-shaped bent portion, and the first side is opposite to the second side.

In some embodiments, the first antenna circuit is disposed on a first surface of the flexible substrate, the second antenna circuit and the antenna communication chip are disposed on a second surface of the flexible substrate, and the first surface is opposite to the second surface.

In some embodiments, the flexible substrate is made of liquid crystal polymer (LCP).

In some embodiments, at least one of the L-shaped bent portion and the U-shaped bent portion is processed by a de-cap process and has a thickness smaller than a thickness of each of the first main body and the second main body.

In accordance with an embodiment of the present invention, the antenna module includes: a flexible substrate, a first antenna circuit and a second antenna circuit. The flexible substrate includes: a first main body, a second main body, a first U-shaped bent portion, an L-shaped bent portion and a second U-shaped bent portion. The first U-shaped bent portion has a first end and a second end opposite each other, in which the first end of the first U-shaped bent portion is connected to the first main body. The L-shaped bent portion has a first end and a second end opposite each other, in which the first end of the L-shaped bent portion is connected to the second end of the first U-shaped bent portion. The second U-shaped bent portion has a first end and a second end opposite to each other, in which the first end of the second U-shaped bent portion is connected to the second end of the L-shaped bent portion, and the second end of the U-shaped bent portion is connected to the second main body. The first antenna circuit is disposed on the first main body. The second antenna circuit is disposed on the second main body.

In some embodiments, the antenna module further includes an antenna communication chip. The antenna communication chip is electrically connected to the first antenna circuit and the second antenna circuit to perform wireless communication by using the first antenna circuit and the second antenna circuit, in which the first antenna circuit, the second antenna circuit and the antenna communication chip are disposed on the same substrate surface of the flexible substrate.

In some embodiments, the L-shaped bent portion has a first straight extension and a second straight extension, the first straight extension is connected to the first U-shaped bent portion, the second straight extension is connected to the second U-shaped bent portion, a reflective plate is disposed on the first straight extension, and another reflective plate is disposed on the second straight extension.

In some embodiments, a distance between the first antenna circuit and the reflective plate corresponding to the first antenna circuit is one quarter of the wavelength of an antenna signal, and a distance between the second antenna circuit and the reflective plate corresponding to the second antenna circuit is one quarter of the wavelength of the antenna signal.

In some embodiments, the flexible substrate is a liquid crystal polymer substrate.

In accordance with an embodiment of the present invention, the portable electric device includes: a casing and an antenna module. The casing has a first side wall and a second side wall, in which the first side wall and the second side wall provide a corner space. The antenna module is disposed in the corner space, in which the antenna module includes: a flexible substrate, a first antenna circuit and a second antenna circuit. The flexible substrate includes: a first main body, a second main body, an L-shaped bent portion and a U-shaped bent portion. The L-shaped bent portion has a first end and a second end opposite to each other, in which the first end of the L-shaped bent portion is connected to the first main body. The U-shaped bent portion has a first end and a second end opposite to each other, in which the first end of the U-shaped bent portion is connected to the second end of the L-shaped bent portion, and the second end of the U-shaped bent portion is connected to the second main body. The first antenna circuit is disposed on the first main body. The second antenna circuit is disposed on the second main body.

In some embodiments, the portable electric device further includes an antenna communication chip. The antenna communication chip is electrically connected to the first antenna circuit and the second antenna circuit to perform wireless communication by using the first antenna circuit and the second antenna circuit.

In some embodiments, the casing further includes a third side wall, and the flexible substrate further includes: a third main body, a second L-shaped bent portion, a second U-shaped bent portion, and a third antenna circuit. The second L-shaped bent portion has a first end and a second end opposite to each other, in which the first end of the second L-shaped bent portion is connected to the first main body. The second U-shaped bent portion has a first end and a second end opposite to each other, in which the first end of the second U-shaped bent portion is connected to the second end of the second L-shaped bent portion, and the second end of the second U-shaped bent portion is connected to the third main body. The third antenna circuit is disposed on the third main body.

In some embodiments, the first antenna circuit, the second antenna circuit, and the third antenna circuit are disposed in accordance with an X-axis, a Y-axis and a Z-axis of a XYZ coordinate system.

In some embodiments, the flexible substrate is a liquid crystal polymer substrate.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual sizes and proportions.

The using of "first", "second", "third", etc. in the specification should be understood for identifying units or data described by the same terminology but are not referred to particular order or sequence.

Figure 1:
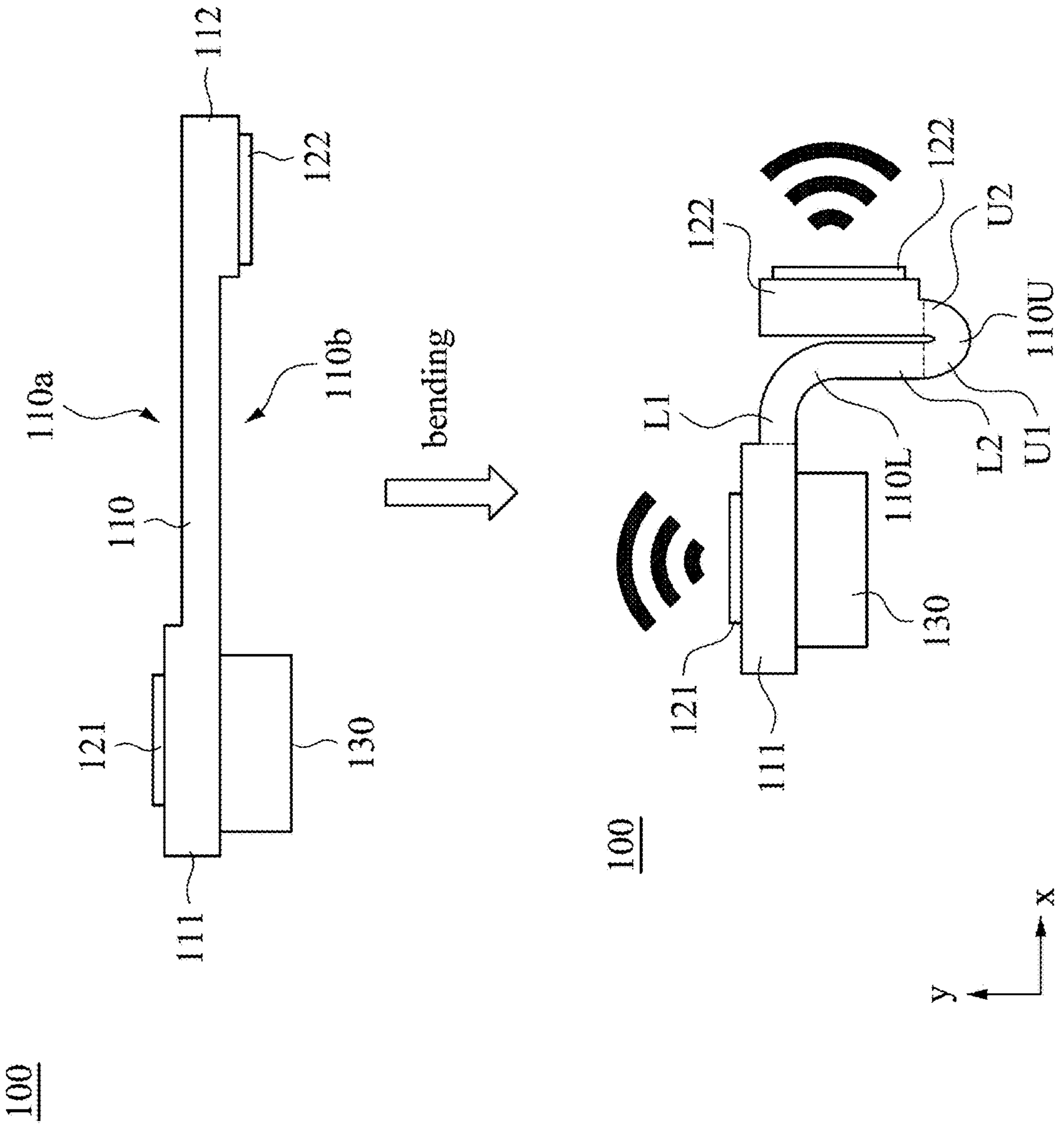
FIG. 1 is a schematic diagram showing an antenna module before/after bending in accordance with an embodiment of the present invention.

Referring to FIG. 1, FIG. 1 is a schematic diagram showing an antenna module 100 before/after bending in accordance with an embodiment of the present invention. The antenna module 100 includes a flexible substrate 110, a first antenna circuit 121, a second antenna circuit 122 and an antenna communication chip 130. The first antenna circuit 121, the second antenna circuit 122 and the antenna communication chip 130 are disposed on the flexible substrate 110. In this embodiment, the flexible substrate 110 includes a first main body 111 and a second main body 112 to allow the first antenna circuit 121, the second antenna circuit 122 and the antenna communication chip 130 to be disposed thereon, in which the first antenna circuit 121 and the second antenna circuit 122 are located on two opposite surfaces 110*a* and 110*b* of the flexible substrate 110, and the first antenna circuit 121 and the antenna communication chip 130 are located on two opposite sides of the first main body 111. The antenna communication chip 130 is electrically connected to the first antenna circuit 121 and the second antenna circuit 122 to use the first antenna circuit 121 and the second antenna circuit 122 to perform wireless communication.

In the embodiments of the present invention, the flexible substrate 110 is made of liquid crystal polymer (Liquid Crystal Polymer; LCP), but the embodiments of the present invention are not limited thereto. In some embodiments, other flexible substrate materials can be applied to the flexible substrate 110.

After the antenna module 100 is bent, the flexible substrate 110 includes an L-shaped bent portion 110L and a U-shaped bent portion 110U. The L-shaped bent portion 110L has a first end L1 and a second end L2 opposite to each other, in which the first end L1 of the L-shaped bent portion 110L is connected to the first main body 111. The U-shaped bent portion 110U has a first end U1 and a second end U2 opposite to each other. The first end U1 of the U-shaped bent portion 110U is connected to the second end L2 of the L-shaped bent portion 110L. The second end U2 of the U-shaped bent portion 110U is connected to the second main body 112.

After the L-shaped bent portion 110L and the U-shaped bent portion 110U are formed by bending the antenna module 100, the first antenna circuit 121 can emit and receive antenna signals outward and along the X axis, and the second antenna circuit 122 can emit and receive antenna signals outward and along the Y-axis. Specifically, a shape of the antenna module 100 after being bent is adapted to the shape of the corner of the casing of the portable electronic device, and thus the space utilization efficiency of the antenna module 100 in the corner can be increased accordingly. Also, wireless communication in the X-axis direction and the Y-axis direction are provided to cover a larger wireless communication range.

Figure 2:
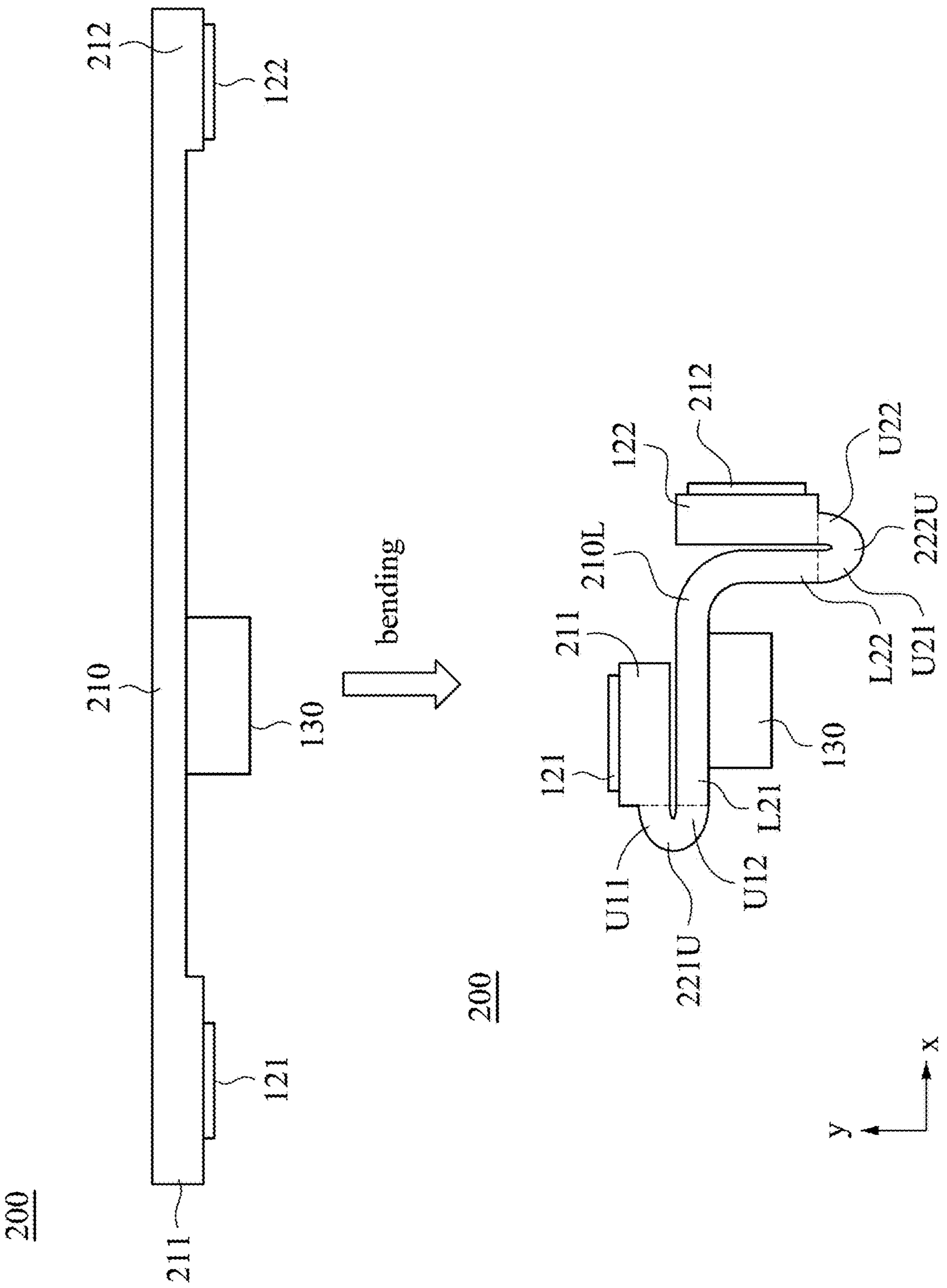
FIG. 2 is a schematic diagram showing an antenna module before/after bending in accordance with an embodiment of the present invention.

Referring to FIG. 2, FIG. 2 is a schematic diagram showing an antenna module 200 before/after bending in accordance with an embodiment of the present invention. The antenna module 200 includes a flexible substrate 210, the first antenna circuit 121, the second antenna circuit 122 and the antenna communication chip 130. The first antenna circuit 121, the second antenna circuit 122 and the antenna communication chip 130 are disposed on the flexible substrate 210. In this embodiment, the flexible substrate 210 includes a first main body 211 and a second main body 212 to allow the first antenna circuit 121, the second antenna circuit 122 and the antenna communication chip 130 to be disposed thereon, in which the circuit 121 and the second antenna circuit 122 are located on the same surface of the flexible substrate 210. A substrate portion located between the first main body 211 and the second main body 212 has a thickness thinner than a thickness of the main body, because a thinning (De-cap) process is performed on the substrate portion between the first main body 211 and the second main body 212. After the thinning process is performed, the antenna module 200 can be bent more easily.

After the antenna module 100 is bent, the flexible substrate 110 includes an L-shaped bent portion 210L, a first U-shaped bent portion 221U, and a second U-shaped bent portion 222U.

The first U-shaped bent portion 221U has a first end U11 and a second end U12 opposite to each other, in which the first end U11 of the first U-shaped bent portion 221U is connected to the first main body 211. The L-shaped bent portion 210L has a first end L21 and a second end L22 opposite to each other, in which the first end L21 of the L-shaped bent portion 210L is connected to the second end U12 of the first U-shaped bent portion 221U. The second U-shaped bent portion 222U has a first end U21 and a second end U22 opposite to each other, in which the first end U21 of the second U-shaped bent portion 222U is connected to the second end L22 of the L-shaped bent portion 210L, and the second end U22 of the U-shaped bent portion 222U is connected to the second main body 212.

After the antenna module 200 is bent to form the L-shaped bent portion 210L, the first U-shaped bent portion 221U and the second U-shaped bent portion 222U, the first antenna circuit 121 can emit and receive antenna signals outward and along the X-axis, and the second antenna circuit 122 can emit and receive antenna signals outward and along the Y-axis. Specifically, a shape of the antenna module 200 after being bent is adapted to the shape of the corner of the casing of the portable electronic device, and thus the space utilization efficiency of the antenna module 200 in the corner can be increased accordingly. Also, wireless communication in the X-axis direction and the Y-axis direction are provided to cover a larger wireless communication range.

In addition, comparing with the antenna module 100, it is easier to dispose the first antenna circuit 121 and the second antenna circuit 122 of the antenna module 200 and the antenna communication chip 130 of 0 on the flexible substrate 210 in the antenna module 200, and the fabrication process of the antenna module 200 is simpler than the fabrication process of the antenna module 100. This is because the first antenna circuit 121, the second antenna circuit 122 and the antenna communication chip 130 of the antenna module 200 are located on the same surface of the flexible substrate 210.

Figure 3:
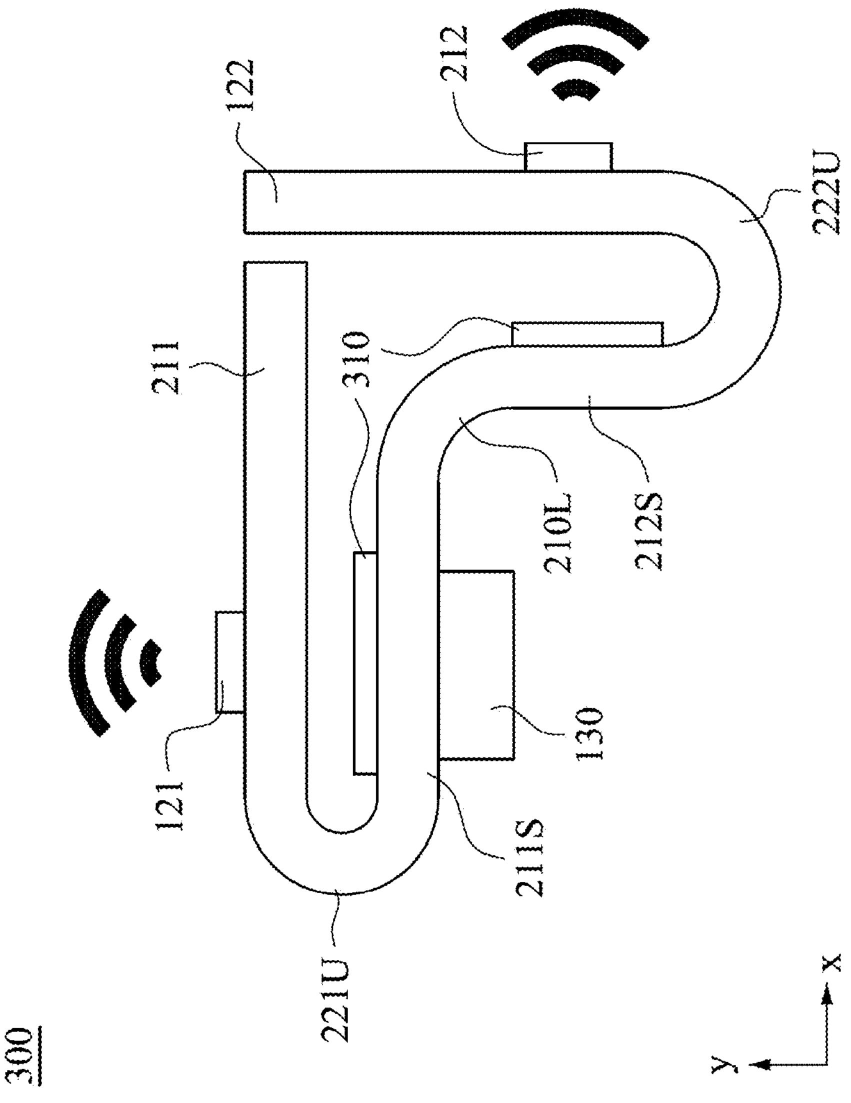
FIG. 3 is a schematic diagram showing a structure of an antenna module after bending in accordance with an embodiment of the present invention.

Referring to FIG. 3. FIG. 3 is a schematic diagram showing a structure of an antenna module 300 after bending in accordance with an embodiment of the present invention. The antenna module 300 is similar to the antenna module 200, but the difference is in that the antenna module 300 further includes reflection plates 310, in which the reflection plates 310 are disposed on the first straight extension 211S and the second straight extension 212S of the L-shaped bent portion 210L. For example, after the antenna module 300 is bent, the first straight extension 211S of the L-shaped bend portion 210L is located adjacent to the first main body 211 and the first antenna circuit 121, and the first straight extension 211S, the first main body 211 and the first antenna circuit 121 are arranged along the Y-axis direction, in which the reflection plate 310 is located between the first main body 211 and the first straight extension 211S, and the reflection plate 310 and the first antenna circuit 121 are located at opposite sides of the first main body 211. For another example, after the antenna module 300 is bent, the second straight extension 212S of the L-shaped bent portion 210L is located adjacent to the second main body 212 and the second antenna circuit 122, and the second straight extension 212S, the second main body 212 and the second antenna circuit 122 are arranged along the X-axis direction, in which the reflection plate 310 is located between the second main body 212 and the second straight extension 212S, and the reflection plate 310 and the second antenna circuit 122 are located at opposite sides of the second main body 212.

Therefore, when the first antenna circuit 121 and the second antenna circuit 122 emit antenna signals, the reflection plate 310 located on the back side of the first antenna circuit 121 and the second antenna circuit 122 reflects the signals from the first antenna circuit 121 and the second antenna circuit 122, thereby improving signal quality of the first antenna circuit 121 and the second antenna circuit 122. For example, a metal surface of the reflective plate 310 has sides each having a length equal to or greater than ½ wavelength of the antenna signals, thereby effectively reflecting the antenna signals of the first antenna circuit 121 and the second antenna circuit 122.

In some embodiments, a bending degree of the first U-shaped bent portion 221U can be controlled to adjust a distance between the first antenna circuit 121 and the corresponding reflection plate 310, so that the effect of the corresponding reflection plate 310 can be adjusted in accordance with the user's demands. Similarly, a bending degree of the second U-shaped bent portion 222U can be controlled to adjust a distance between the second antenna circuit 122 and the corresponding reflecting plate 310, so that the effect of the corresponding reflecting plate 310 can be adjusted in accordance with the user's demands. In this embodiment, the distance between the first antenna circuit 121 and the corresponding reflecting plate is a quarter of the wavelength of the antenna signal of the first antenna circuit 121. The distance between the second antenna 212 and the corresponding reflecting plate is a quarter of the wavelength of the antenna signal of the second antenna 212. In this way, better reflection effect can be achieved.

Figure 4:
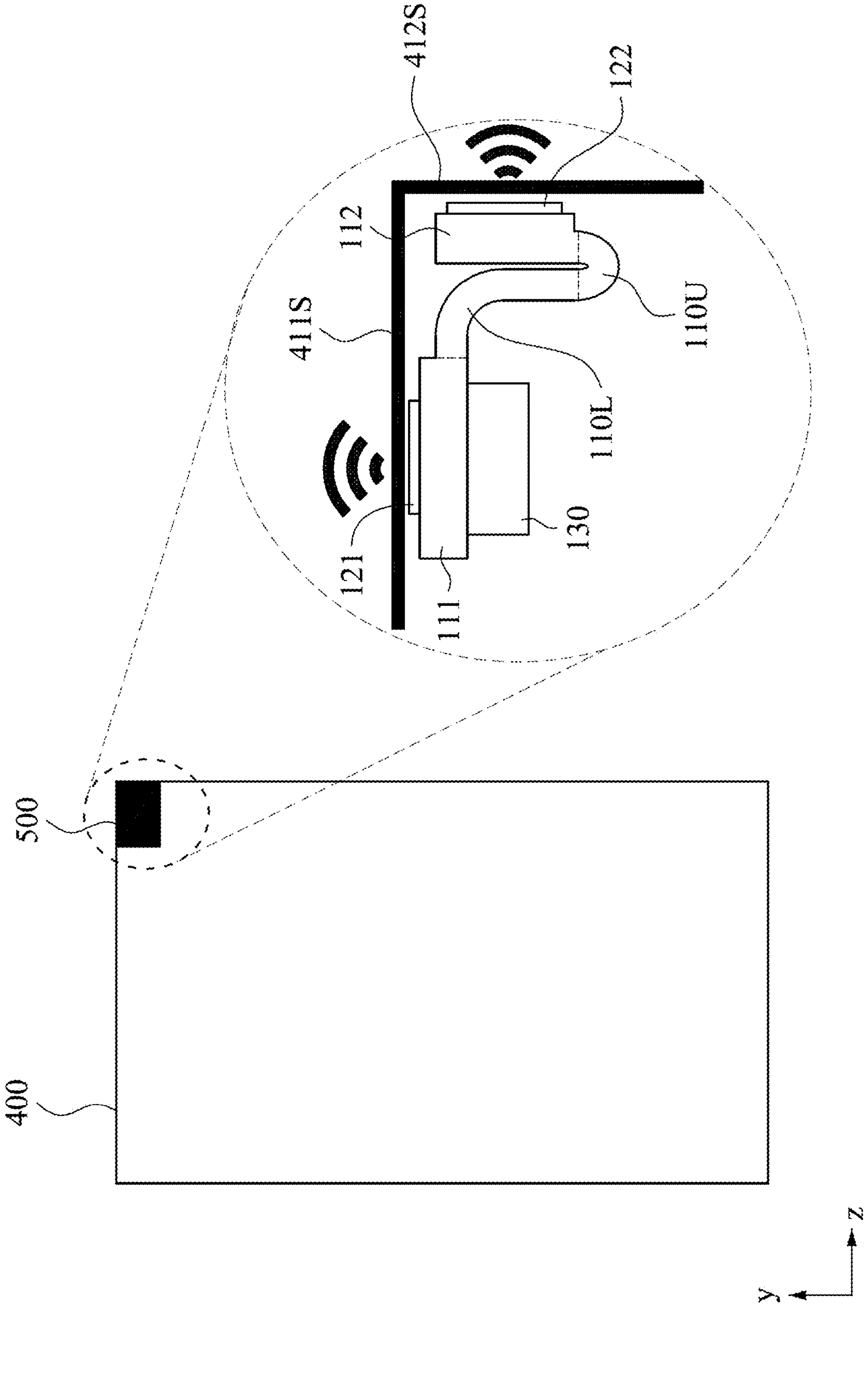
FIG. 4 is a schematic diagram showing a front view of structures of a portable electronic device and an antenna module in the portable electronic device in accordance with an embodiment of the present invention.
Figure 5:
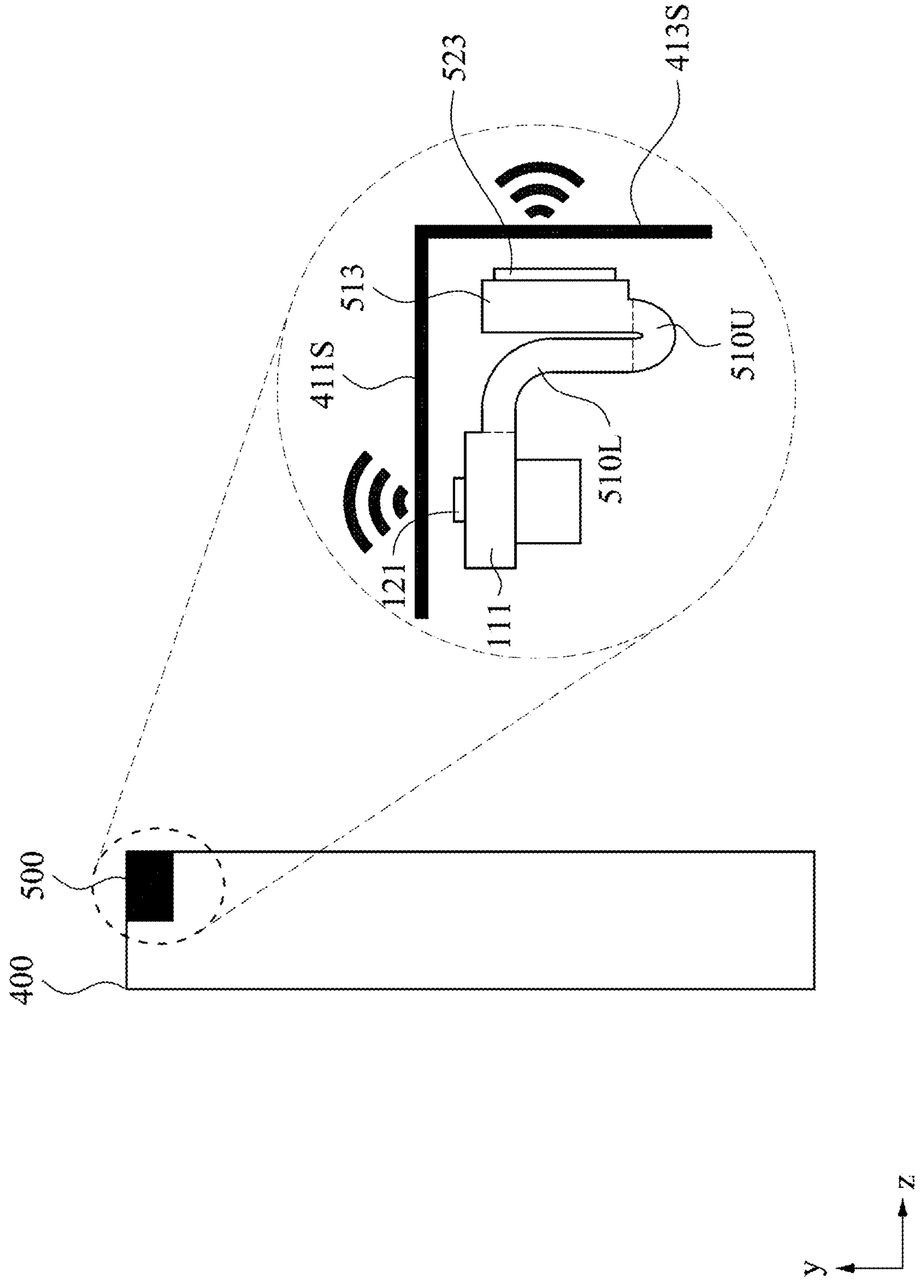
FIG. 5 is a schematic diagram showing a side view of structures of the portable electronic device and the antenna module in the portable electronic device in accordance with an embodiment of the present invention.
Figure 6:
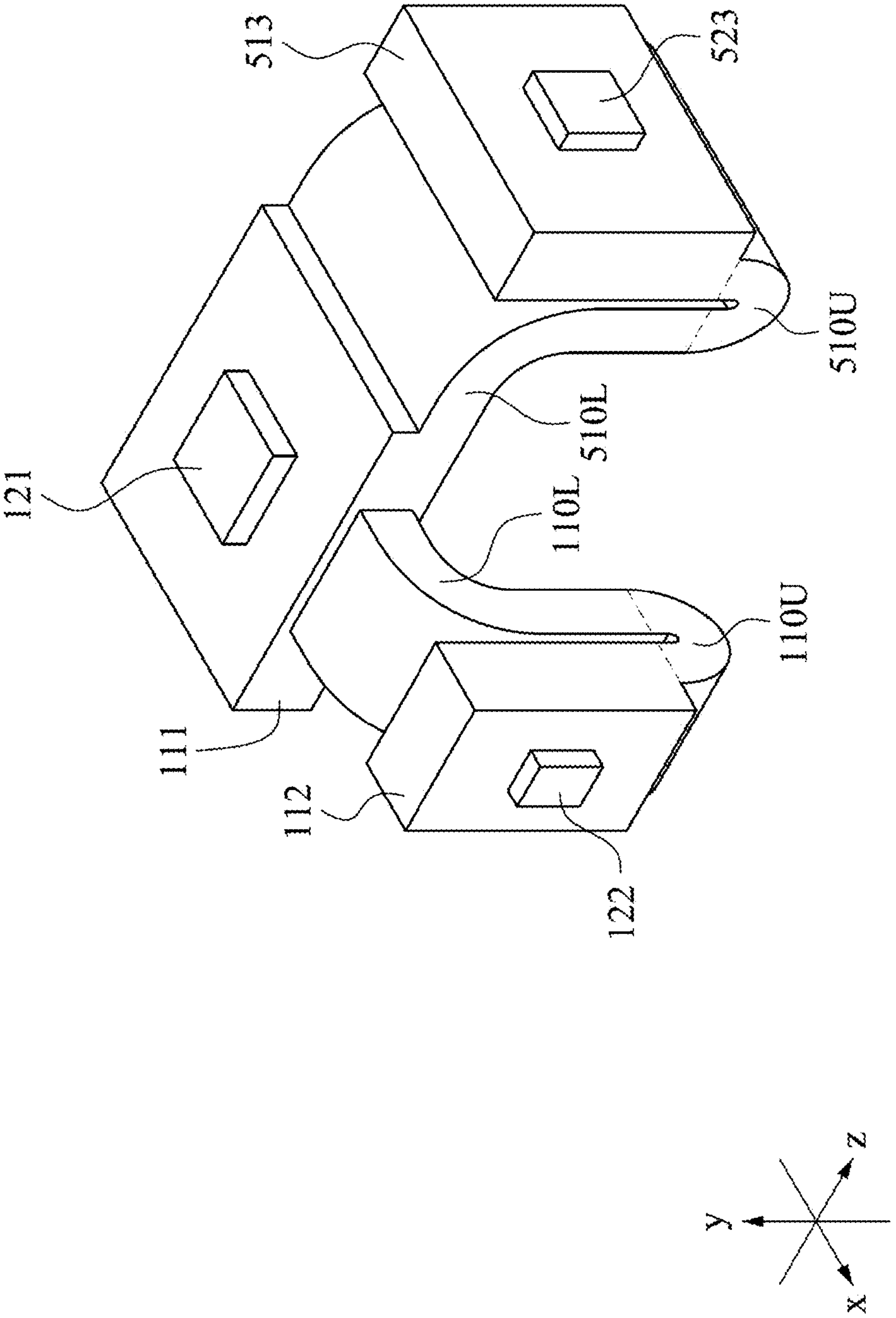
FIG. 6 is a schematic diagram showing a 3D structure of the antenna module in accordance with an embodiment of the present invention.

Referring to FIG. 4, FIG. 5 and FIG. 6 simultaneously, FIG. 4 is a schematic diagram showing a front view of structures of a portable electronic device and an antenna module in the portable electronic device in accordance with an embodiment of the present invention, FIG. 5 is a schematic diagram showing a side view of structures of the portable electronic device and the antenna module in the portable electronic device in accordance with the embodiment of the present invention, and FIG. 6 is a schematic diagram showing a 3D structure of the antenna module. In this embodiment, the portable electronic device includes a casing 400 and an antenna module 500. The antenna module 500 is disposed at the upper right corner of the casing 400 to provide a wireless communication function for the portable electronic device. Specifically, the casing 400 includes side walls 411S and 412S. The side walls 411S and 412S define a corner, the antenna module 500 is disposed at the corner, and a volume of the antenna module 500 is adapted to the space of the corner. Therefore, the corner space of the portable electric device can be efficiently used for receiving the antenna module 500 capable of providing the communication function for the portable electronic device. The antenna module 500 is similar to the above-mentioned antenna module 100, but the difference is in that the antenna module 100 further includes: a third main body 513, an L-shaped bent part 510L, a U-shaped bent part 510U and a third antenna circuit 523, in which the third antenna circuit 523 is disposed on the third main body 513 and is electrically connected to the antenna communication chip 130 to provide a wireless communication function.

As shown in FIG. 4, the first main body 211 and the first antenna circuit 121 of the antenna module 500 are arranged along the Y-axis to provide wireless communication in the Y-axis direction (toward the outside of the side wall 411S). Further, the L-shaped bent portion 110L, the U-shaped bent portion 110U, the second main body 112 and the second antenna circuit 122 of the antenna module 500 are arranged along the X-axis direction, so that the second antenna circuit 122 on the second main body 112 can provide wireless communication in the X-axis direction (toward the outside of side wall 412S). Furthermore, as shown in FIG. 5, the L-shaped bent portion 510L, the U-shaped bent portion 510U, the third main body 513 and the third antenna circuit 523 of the antenna module 500 are arranged along the Z-axis direction, so that the third antenna circuit 523 on the third main body 513 can provide wireless communication in the Z-axis direction (toward the outside of the back of the casing 400). In FIG. 5, the L-shaped bent portion 110L, the U-shaped bent portion 110U, the second main body 112 and the second antenna circuit 122 of the antenna module 500 are omitted for simplification.

Although, the antenna module 500 shown in FIG. 4 to FIG. 5 is disposed in the upper right corner space of the casing 400, but embodiments of the present invention are not limited thereto. In some embodiments, the antenna module 500 may be disposed in other corner space of the casing 400. In some embodiments, the above-mentioned antenna module 100, 200 or 300 can be disposed in a corner space of the casing 400.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An antenna module, comprising:

a flexible substrate comprising:

a first main body;

a second main body;

an L-shaped bent portion having a first end and a second end opposite to each other, wherein the first end of the L-shaped bent portion is connected to the first main body; and a U-shaped bent portion having a first end and a second end opposite to each other, wherein the first end of the U-shaped bent portion is connected to the second end of the L-shaped bent portion, and the second end of the U-shaped bent portion is connected to the second main body;

a first antenna circuit disposed on the first main body; and a second antenna circuit disposed on the second main body.

2. The antenna module of claim 1, further comprising:

an antenna communication chip electrically connected to the first antenna circuit and the second antenna circuit to perform wireless communication, wherein the antenna communication chip is located on a first surface of the L-shaped bent portion, the second main body is located on a second surface of the L-shaped bent portion, and the first surface is opposite to the second surface.

3. The antenna module of claim 2, wherein the first antenna circuit is disposed on a first surface of the flexible substrate, the second antenna circuit and the antenna communication chip are disposed on a second surface of the flexible substrate, wherein the first surface is opposite to the second surface.

4. The antenna module of claim 1, wherein the flexible substrate is made of liquid crystal polymer (LCP).

5. The antenna module of claim 1, wherein at least one of the L-shaped bent portion and the U-shaped bent portion is de-cap processed and has a thickness smaller than that of the first main body and the second main body.

6. An antenna module, comprising:

a flexible substrate, comprising:

a first main body;

a second main body;

a first U-shaped bent portion having a first end and a second end opposite each other, wherein the first end of the first U-shaped bent portion is connected to the first main body;

an L-shaped bent portion having a first end and a second end opposite each other, wherein the first end of the L-shaped bent portion is connected to the second end of the first U-shaped bent portion; and a second U-shaped bent portion having a first end and a second end opposite to each other, wherein the first end of the second U-shaped bent portion is connected to the second end of the L-shaped bent portion, and the second end of the U-shaped bent portion is connected to the second main body;

a first antenna circuit disposed on the first main body; and a second antenna circuit disposed on the second main body.

7. The antenna module of claim 6, further comprising:

an antenna communication chip electrically connected to the first antenna circuit and the second antenna circuit to perform wireless communication, wherein the first antenna circuit, the second antenna circuit and the antenna communication chip are disposed on the same surface of the flexible substrate.

8. The antenna module of claim 6, wherein the L-shaped bent portion has a first straight extension and a second straight extension, the first straight extension is connected to the first U-shaped bent portion, the second straight extension is connected to the second U-shaped bent portion, a reflective plate is disposed on the first straight extension, and another reflective plate is disposed on the second straight extension.

9. The antenna module of claim 8, wherein a distance between the first antenna circuit and the corresponding reflective plate is one quarter of the wavelength of an antenna signal, and a distance between the second antenna circuit and the corresponding reflective plate is one quarter of the wavelength of the antenna signal.

10. The antenna module of claim 6, wherein the flexible substrate is made of liquid crystal polymer (LCP).

11. A portable electric device, comprising:

a casing having a first side wall and a second side wall, wherein the first side wall and the second side wall provide a corner space; and an antenna module disposed in the corner space, wherein the antenna module comprises:

a flexible substrate comprising:

a first main body;

a second main body;

an L-shaped bent portion having a first end and a second end opposite to each other, wherein the first end of the L-shaped bent portion is connected to the first main body; and a U-shaped bent portion having a first end and a second end opposite to each other, wherein the first end of the U-shaped bent portion is connected to the second end of the L-shaped bent portion, and the second end of the U-shaped bent portion is connected to the second main body;

a first antenna circuit disposed on the first main body; and a second antenna circuit disposed on the second main body.

12. The portable electric device of claim 11, further comprising:

an antenna communication chip electrically connected to the first antenna circuit and the second antenna circuit to perform wireless communication.

13. The portable electric device of claim 11, wherein the casing further comprises a third side wall, and the flexible substrate further comprises:

a third main body;

a second L-shaped bent portion having a first end and a second end opposite to each other, wherein the first end of the second L-shaped bent portion is connected to the first main body;

a second U-shaped bent portion having a first end and a second end opposite to each other, wherein the first end of the second U-shaped bent portion is connected to the second end of the second L-shaped bent portion, and the second end of the second U-shaped bent portion is connected to the third main body; and a third antenna circuit disposed on the third main body.

14. The portable electric device of claim 13, wherein the first antenna circuit, the second antenna circuit, and the third antenna circuit are disposed in accordance with a X-axis, a Y-axis and a Z-axis of a XYZ coordinate system.

15. The portable electric device of claim 11, wherein the flexible substrate is made of liquid crystal polymer (LCP).

* * * * *